(12) United States Patent
Yeh et al.

(10) Patent No.: US 8,872,265 B2
(45) Date of Patent: Oct. 28, 2014

(54) TRENCH POWER MOSFET AND FABRICATION METHOD THEREOF

(75) Inventors: Chun-Ying Yeh, Hsinchu (TW); Yuan-Ming Lee, Taichung (TW)

(73) Assignee: Great Power Semiconductor Corp., New Taipei (TW)

( * ) Notice: Subject to any disclaimer, the term of this patent is extended or adjusted under 35 U.S.C. 154(b) by 0 days.

(21) Appl. No.: 13/572,093

(22) Filed: Aug. 10, 2012

(65) Prior Publication Data

US 2013/0292761 A1 Nov. 7, 2013

(30) Foreign Application Priority Data

May 4, 2012 (TW) .............................. 101116020 A

(51) Int. Cl.
*H01L 29/66* (2006.01)
(52) U.S. Cl.
USPC ........... 257/334; 257/330; 257/331; 257/332; 257/335
(58) Field of Classification Search
USPC ......................................... 257/330–335, 520
See application file for complete search history.

(56) References Cited

U.S. PATENT DOCUMENTS

| 7,595,542 B2 * | 9/2009 | Park et al. ...................... 257/495 |
| 2006/0118864 A1 * | 6/2006 | Hirler et al. .................... 257/335 |
| 2011/0121386 A1 * | 5/2011 | Hsieh .............................. 257/334 |
| 2011/0227152 A1 * | 9/2011 | Hsu et al. ....................... 257/334 |
| 2012/0112268 A1 * | 5/2012 | Tai et al. ........................ 257/330 |

* cited by examiner

*Primary Examiner* — Matthew W Such
*Assistant Examiner* — Frederick B Hargrove
(74) *Attorney, Agent, or Firm* — Li & Cai Intellectual Property (USA) Office

(57) ABSTRACT

An exemplary embodiment of the present disclosure illustrates a trench power MOSFET which includes a base, a plurality of first trenches, and a plurality of second trenches. The base has an active region and a termination region, wherein the termination region surrounds the active region. The plurality of first trenches is disposed in the active region. The plurality of second trenches is disposed in the termination region, wherein the second trenches extend outward from the active region side. The second trenches have isolation layers and conductive material deposited inside, in which the isolation layers are respectively disposed in the inner surface of the second trenches. The disclosed trench power MOSFET having the second trenches disposed in the termination region can increase the breakdown voltage thereof while minimize the termination region area thereby reduce the associated manufacturing cost.

14 Claims, 10 Drawing Sheets

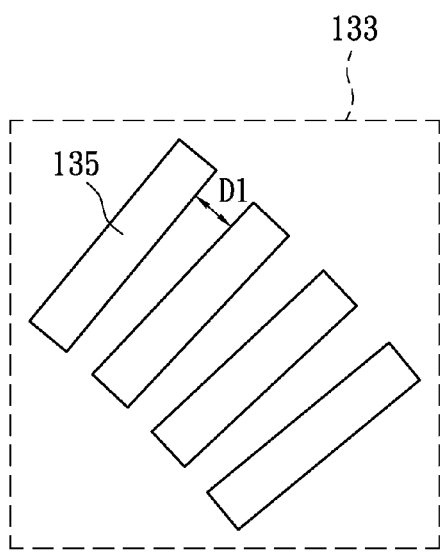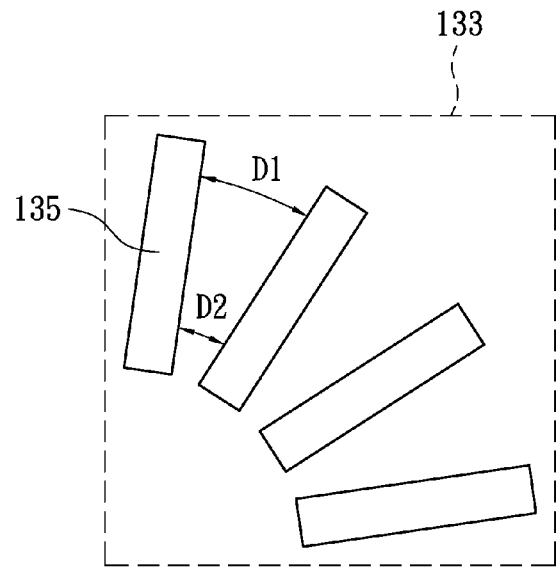
FIG. 5A          FIG. 5B
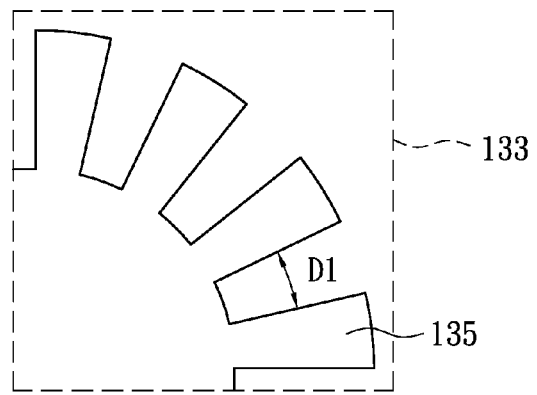
FIG. 5C

TRENCH POWER MOSFET AND FABRICATION METHOD THEREOF

BACKGROUND

1. Technical Field

The present disclosure relates to a semiconductor structure and the fabrication method thereof in particular, to trench power metal oxide semiconductor field effect transistor (MOSFET) and fabrication method thereof.

2. Description of Related Art

In order to fulfill energy saving and power consumption reduction requirements, power semiconductor devices e.g., power MOSFETs have been widely utilized in high voltage equipment. In the field of power semiconductor, the voltages withstanding capability (e.g., breakdown voltage BVdss) and conductivity characteristics (on resistance Ron) are known to be the most important capability indices for the power semiconductors.

In practice, to increase the breakdown voltage of a power semiconductor, at least a guard ring structure consisting of a p-n junction formed of a P-type semiconductor and an N-type semiconductor and a metal formed field plate is disposed on the wafer surrounding the power semiconductor. Taking a trench power MOSFET as an example, the guard ring structure may be formed by implanting a p-type dopant into the epitaxial layer having N-type dopant, then depositing metal layer thereon. Such that an electric field with moderate electric field distribution can be formed at the bottom (i.e. drain terminal) of the trench power MOSFET thereby increase the breakdown voltage of the trench power MOSFET. However, since each guard ring may only increase the breakdown voltage of the power semiconductor by a certain voltage value (e.g., 30V), thus most often a plurality of the above described guard ring structures must be disposed accordingly for the power semiconductor to attain the required breakdown voltage. Implementing the described guard ring structure not only may waste the usable wafer area but also increase the manufacturing complexity henceforth the manufacture cost of the power semiconductor may be substantially increased and thereby reduce the associated economic efficiency.

SUMMARY

The present disclosure provides a trench power MOSFET, which through disposes a plurality of trenches in the termination region surrounding the components in the active region, and with each trench extending outwardly from the active region may increase the voltage withstanding capability of the trench power MOSFET while reduce the on resistance. Meanwhile, the required area for the voltage withstanding design can be effectively reduced thereby reducing the associated manufacturing cost.

An exemplary embodiment of the present disclosure provides a trench power MOSFET. The trench power MOSFET includes a base, a plurality of first trenches and a plurality of second trenches. The base has an active region and a termination region, wherein the termination region surrounds the active region. The plurality of first trenches is disposed in the active region. Each of the second trenches having an isolation layer and a conductive material is disposed in the terminal region. Each of the second trenches extends outwardly from the active region side. The isolation layer is disposed to cover the inner surface of each second trench.

According to one exemplary embodiment of the present disclosure, the trench power MOSFET further includes at least a first doped region. The first doped region is formed between the adjacent second trenches. The conductive type associated with the first doped region is opposite to the conductive type of the base.

According to one exemplary embodiment of the present disclosure, the trench power MOSFET further includes at least a second doped region. The second dope region is formed between the adjacent second trenches. The second doped region is disposed above the first doped region. The conductive type associated with the second doped region the same as or opposite to the conductive type of the base.

According to one exemplary embodiment of the present disclosure, the second trenches are radially arranged around the active region.

According to one exemplary embodiment of the present disclosure, the terminal region has at least a side region and a corner region. The second trenches located are disposed in fan-shaped arrangement in the corner region.

According to one exemplary embodiment of the present disclosure, the second trenches are equally spaced in the corner region.

According to one exemplary embodiment of the present disclosure, each of the second trenches in the corner region with one end thereof being nearing the active region side having the trench width smaller than the trench width of the other end thereof being away from the active region.

An exemplary embodiment of the present disclosure provides a trench power MOSFET fabrication method including the following steps: providing a base which has an active region and a terminal region wherein the termination region surrounds the active region; forming a plurality of first trenches in the active region; forming a plurality of second trenches in the terminal region, wherein the second trenches extends outwardly from the active region, respectively; forming an isolation layer respectively covering the inner surface of the second trenches; filling in a conductive material in the second trenches, respectively.

To sum up, an exemplary embodiment of the present disclosure provides a trench power MOSFET. In which a plurality of trenches is disposed in the termination region surrounding the components in the active region wherein each trench extends outwardly from the active region with isolation layer and conductive material disposed inside. Consequently, when the trench power MOSFET operates in reverse biased mode, the reduce surface field principle can be utilized through using the potential pinching effect generating charge balance and electric field relaxation effects. Thus, electric field with moderate electric field distribution may form on the side or bottom of trench producing the trench power MOSFET has high voltage withstanding capability and low on resistance. Meanwhile the require area for the voltage withstanding design may be reduced thereby reduce the associated manufacturing cost.

In order to further understand the techniques, means and effects of the present disclosure, the following detailed descriptions and appended drawings are hereby referred, such that, through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

FIG. 5A~5C respectively show diagrams illustrating the arrangement of the second trenches in accordance to the fourth exemplary embodiment of the present disclosure.

DESCRIPTION OF THE EXEMPLARY EMBODIMENTS

Figure 1:
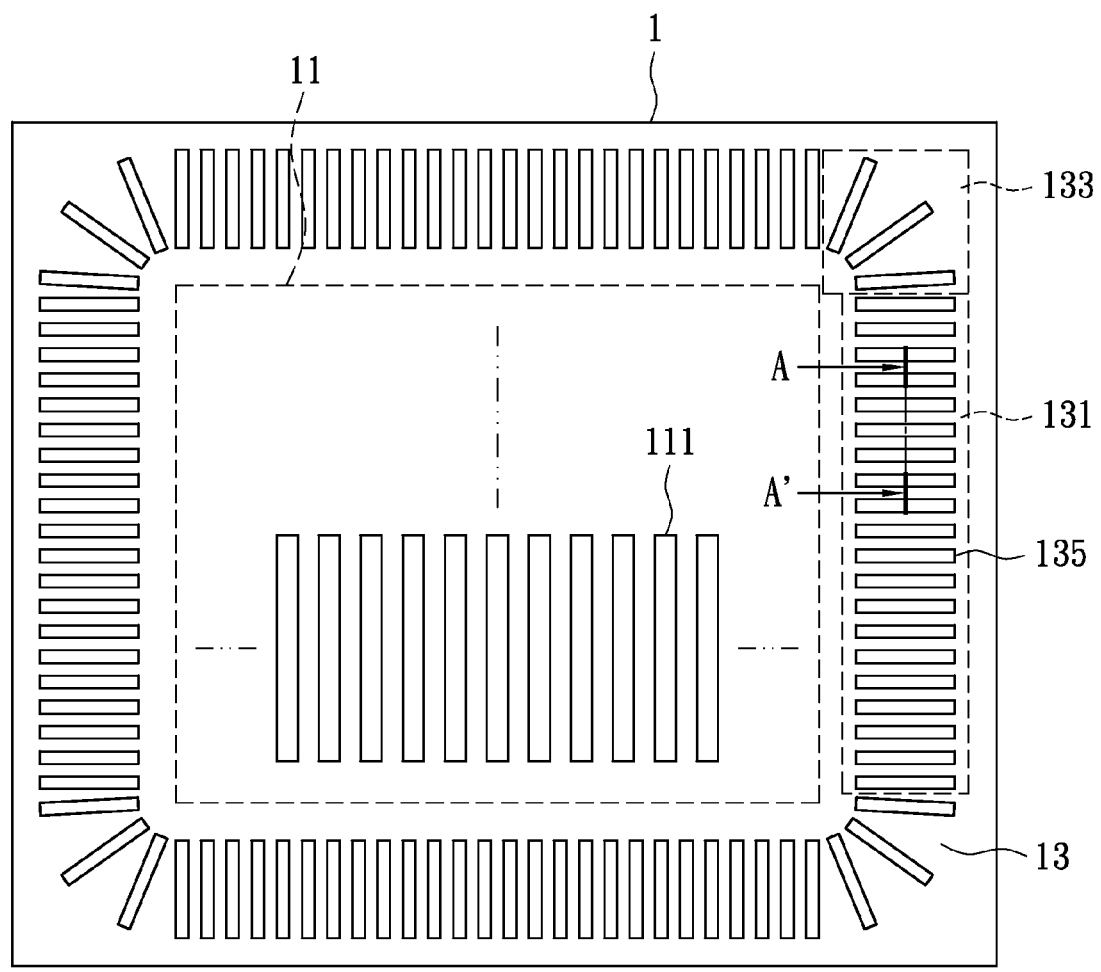
FIG. 1 shows a top view of a trench power MOSFET in accordance to the first exemplary embodiment of the present disclosure.

Reference will now be made in detail to the exemplary embodiments of the present disclosure, examples of which are illustrated in the accompanying drawings. Wherever possible, the same reference numbers are used in the drawings and the description to refer to the same or like parts.

First Exemplary Embodiment

Please refer to FIG. 1, which shows a top view of a trench power MOSFET in accordance to the first exemplary embodiment of the present disclosure. The trench power MOSFET includes a substrate (not shown) and an epitaxial layer 1, a plurality of first trenches 111, and a plurality of second trenches 135 disposed thereon. The substrate and the epitaxial layer 1 collectively formed a base.

The epitaxial layer 1 in the instant embodiment may be grown on the substrate using the epitaxial growth technique. However, in other embodiment, the base may comprise of only the substrate that is the active region and the termination region may be directly formed on the substrate without the need to grow the epitaxial layer 1, hence the instant embodiment shall not be limited herein. It is worth to note that the substrate may be a silicon substrate having a first conductive type dopant. The drain region of the trench power MOSFET is disposed on the bottom of the substrate. In practice, there is no limitation on the substrate type and the dopant type thereof, hence, the instant embodiment is not limited thereto. The epitaxial layer 1 has the first conductive type dopant in which the first conductive type dopant may be an N-type dopant, but the instant embodiment is not limited herein.

The epitaxial layer 1 has an active region 11 and a termination region 13. The termination region 13 surrounds the active region 11. In other words, the termination region 13 circumscribes the active region 11 and is placed adjacent to the active region. The structure of the termination region 13 may be used to increase the voltage withstanding capability of the trench power MOSFET so as to protect the components disposed in the active region 11 thereby preventing excessive voltage damage to the components within the active region 11.

To put it concretely, the plurality of first trenches 111 is disposed within the active region 11 of the epitaxial layer 1 while the plurality of second trenches 135 is disposed within the termination region 13 of the epitaxial layer 1. The plurality of first trenches 111 are respectively formed by extending downwardly from an upper surface of the epitaxial layer 1. The plurality of second trenches 135 is respectively formed by extending downwardly in the termination region 13 and outwardly from the active region 11 side on the upper face of the epitaxial layer 1. Or equivalently, each second trench 135 is formed by extending from the side adjacent to the first trench 111 in the active region 11 toward the side that is away from the active region 11 (e.g., close to the edge of the epitaxial layer 1). More specifically, one ends of the plurality second trenches 135 adjacent to the active region 11 side are connected or spaced by a distance from the side of first trench 111 in the active region 11 which is nearing the termination region 13. The spacing between the plurality of second trenches 135 opens in the direction away from the active region 11 side. The trench length of each second trench 135 is defined by one end thereof nearby the active region 11 to the other end thereof away from the active region 11. The trench width of each second trench 135 is defined by one inner side thereof to the other corresponding side thereof.

It is worth to note the first and second trenches may be formed simultaneously on the epitaxial layer 1 through lithography and etching processes, wherein in the lithography process, a mask having corresponding patterns positions and shapes associated with the first and the second trenches is disposed. However the instant embodiment is not limited thereto, the first and the second trenches may be respectively formed on the epitaxial layer 1 using different manufacturing processes. In particular, the second trench 135 may be implemented through using the deep trench or the shallow trench isolation (STI) process. The second trenches 135 can be radially arranged around the first trenches 111 in the active region 11.

Moreover, the termination region 13 includes at least a side region 131 and a corner region 133, wherein the corner region 133 is next to the side region 131. As shown in FIG. 1, the second trenches 135 in side region 131 are disposed in substantial rectangular arrangement. The second trenches 135 in the corner region 133 are disposed in substantial fan-shaped arrangement with equal spacing. Or equivalently, the second trenches 135 located in the side region 131 are arranged in substantial parallel manner. The second trenches 135 located in the corner region 133 are arranged with an angle in between, in which the angle between the adjacent second trenches may be the same.

However, in practice the second trenches may have other different arrangements including but not limited to radiation arrangement, circularly arrangement, and gear arrangement configured with different angle or spacing in between. The details of the arrangement are described by other disclosed embodiments. It shall be noted that there is no limitation placed on the arrangement of the second trenches, thus the instant embodiment is not limited to the example provided herein.

The first trenches 111 and the second trenches 135 in the instant embodiment have the same trench depth. Similarly, the trench width of the first trenches 111 are the same as the trench width of the second trenches 135. In practice, the trench depth and the trench width associated with the first trenches 111 and the second trenches 135 may respectively formed based on actual process needs and the instant embodiment is not limited herein. Moreover, an actual implementation for the first and second trenches 111, 135 are provided in other embodiment, hence further descriptions are hereby omitted.

Next, please refer to FIG. 2A~2G in conjunction with FIG. 1. FIG. 2A~FIG. 2G respectively show cross section views illustrating the trench power MOSFET taken along line A-A' in accordance to the first exemplary embodiment of the present disclosure.

Figure 2A:
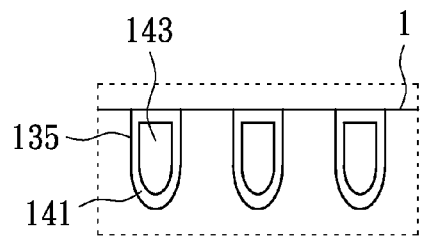
FIG. 2A~2G respectively show cross section views illustrating the trench power MOSFET taken along line A-A' in accordance to the first exemplary embodiment of the present disclosure.

As shown in FIG. 2A, each of the second trenches 135 has an isolation layer 141 and a conductive structure 143 formed of conductive material. The isolation layer 141 covers the conductive structure 143 and is formed inside the second trench 135 by thermal oxidation or chemical vapor deposition (CVD) process. In practice, the isolation layer 141 may be formed of isolation material such as oxide or silicon nitride. The conductive structure 143 may be formed of conductive material such as polysilicon, aluminum, or cooper, but the instant embodiment is not limited thereto.

Figure 2B:
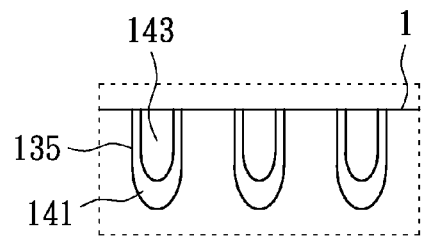

The distance between the conductive structure 143 and the opening of the second trench 135 may be formed by configuring the thickness of the isolation layer 141. The distance between the conductive structure 143 and the opening of the second trench 135 may be zero. In other words, as shown in FIG. 2B, the isolation layer 141 covers only the sidewall and the bottom side of the second trench 135. The isolation layer 141 does not cover the top side of the conductive structure 143. The size of the conductive structure 143 can be defined by the configured the deposition ratio of the isolation layer 141 in the second trench 135. For instance, the width of the conductive structure 143 in the second trench 135 may be defined by the thickness of the isolation layer 141 deposited along the direction that is away from the active region 11 (i.e., the outer edge of the epitaxial layer 1). The thickness of the isolation layer 141 in practice may be configured according to the actual potential field distribution relaxation efficacy and the instant embodiment is not limited thereto.

Figure 2C:
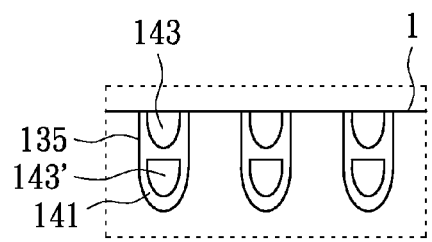

It is worth to note that even though in the instant embodiment the second trench 135 has one conductive structure 143, however the second trench 135 may also have two or more conductive structures formed of conductive material according to the design needs. For example, as shown in FIG. 2C, the isolation layer 141 may be deposited covering multiple conductive structures 143, 143' to electrically isolate the conductive structures, however the instant embodiment is not limited thereto. The potential levels associated with the conductive structures 143, 143' are not limited to the same potential. In other words, the conductive structures 143, 143' may respectively be floating, grounded, or connected to the gate metal layer of the components in the active region 11.

Specifically, the conductive structure 143 in the second trench 135 may in practice electrically connect to a metal layer (not shown). The metal layer may be floating, grounded, or connected to the gate metal layer of the components in the active region 11 of FIG. 1. Consequently, when the trench power MOSFET operates in the reverse-biased, the conductive structures 143 in the second trenches 135 disposed in the termination region 13 may generate the potential pinching effect creating charge balance and electrical field relaxation effect and thereby increase the voltage withstanding capability of the trench power MOSFET.

Figure 2D:
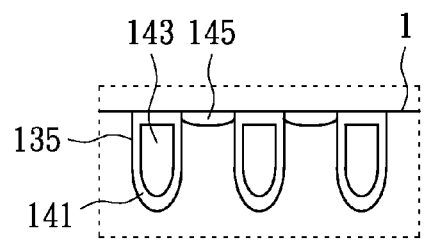

In addition, as shown in FIG. 2D, at least a first dopant region 145 may be implanted between the adjacent second trenches 135, wherein the first dopant region 145 is formed by implanting a second conductive type dopant. The second conductive type dopant in the instant embodiment may be a P-type dopant and can be implanted between the adjacent second trenches 135 using ion implantation method. To put it concretely, the first dopant region 145 is formed by implanting the second conductive type dopant downwardly from the surface of the epitaxial layer 1 using thermal diffusion. Furthermore, the concentration of the second conductive type dopant implanted in each first dopant region 145 can be configured according to the electrical field distribution relaxation effect and voltage withstanding requirements and the instant embodiment is not limited thereto. It is worth to note that the conductive type of the first dopant region 145 must be different from the conductive type associated with the substrate and the epitaxial layer 1 but is not limited to P-type dopant.

Figure 2E:
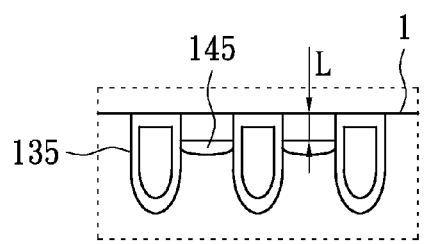

In addition, it is not necessary to have the first dopant region 145 next to the surface of the epitaxial layer 1. As shown in FIG. 2E, there may exist a distance L in between the first dopant region 145 and the epitaxial layer 1. In practice, the distance L may be configured based on the required electrical field distribution relaxation effect and voltage withstanding capability and the instant embodiment is not limited thereto. Moreover, as previously described multiple first dopant regions 145 having the second conductive type dopant may be implanted between the adjacent second trenches 135. The distance between each neighboring first dopant region may be configured according to the voltage withstanding requirements.

Figure 2F:
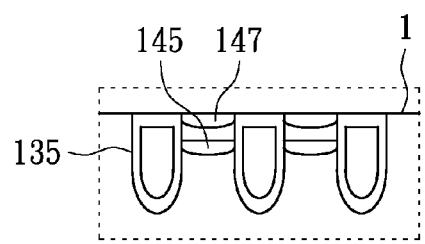
Figure 2G:
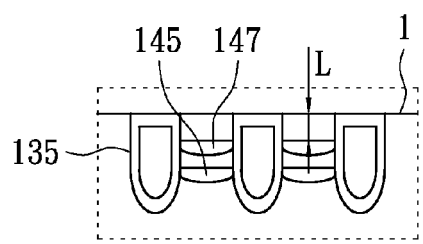

As shown in FIG. 2F, at least a second dopant region 147 having a dopant with conductive type which is the same as the epitaxial layer 1 (i.e., the first conductive type dopant such as N-type dopant) or is different from the conductive type of the epitaxial layer 1 (i.e., the second conductive type dopant such as P-type dopant) can be formed between the adjacent second trenches 135 in corresponding to the position of the first dopant region 145. The second dopant region 147 is disposed above the first dopant region 145. The first dopant region 145 and the second dopant region 147 having different conductive types of dopant respectively and are separate from each other. Each second dopant region 147 has the first conductive type dopant but the associated concentration can be configured according to the required electrical field relaxation or voltage withstanding capability, thus the instant embodiment is not limited thereto. The relative placement of the first dopant region 145 and the second dopant region 147 can be vertically arranged or horizontally arranged. Furthermore, the placements for the first dopant region 145 and the second dopant region 147 are not restricted to between the adjacent second trenches 135. The depths of the first dopant region 145 and the second dopant region 147 may be greater than the depth of the second trench 135 with the placements configured based on the required electrical field relaxation effect or voltage withstanding capability.

As aforementioned, it is not necessary for the second dopant region 147 to be exactly beneath the surface of the epitaxial layer 1. In other word, a predetermined distance L may be kept between the second dopant region 147 and the epitaxial layer 1. The distance L may be configured based on the required electrical field relaxation effect or voltage withstanding capability and the instant embodiment is not limited thereto. It shall be noted that FIG. 2A~2G only serve as illustrations of cross section along line A-A', respectively and the present disclosure is note limited herein.

The trench power MOSFET may achieve the required voltage withstanding capability (i.e., the breakdown voltage BVdss) while effectively reduce the termination design area through adjusting the first conductive type dopant concentration of the epitaxial layer 1 and the actual structure of the second trenches 135 in terminal region 13 (e.g., the trench width, relative spacing between the second trenches 135, trench depth, and conductive material composition) as well as the associated quantities, actual placement and concentration of the first dopant region 145 and the second dopant region 147. In addition the ratio of equivalent resistance and thickness associated with the epitaxial layer 1 may be optimized reducing the resistance of on resistance (Ron) thereby lowering the conductive loss of the trench power MOSET.

Second Exemplary Embodiment

In addition, the placement of the first dopant region 145 may have other implementation. Please refer to FIG. 3A and FIG. 3B, which respectively show diagrams illustrating a first and a second doped region distribution associated with the trench power MOSFET in accordance to the second exemplary embodiment of the present disclosure.

Figure 3A:
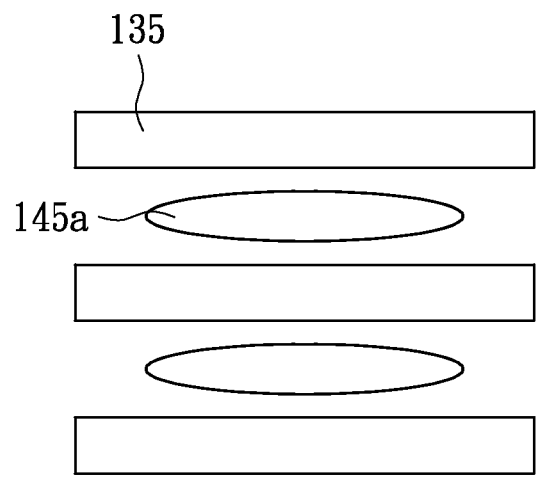
FIG. 3A~3B respectively show diagrams illustrating a first and a second doped region distribution associated with the trench power MOSFET in accordance to the second exemplary embodiment of the present disclosure.

As shown in FIG. 3A, the first dope region 145a having dopant with conductive type different from the epitaxial layer 1 may be implanted substantially in the central region between the adjacent second trenches 135. The length of the first dopant region 145a falls within the trench length of the second trench 135. However, the instant disclosure is not limited thereby, as the length of the first dopant region 145a may be greater or equal to the trench length of the second trench 135. The maximum width of the first dopant region 145a is defined by the gap size between the adjacent second trenches 135. The first dopant region 145 can be disposed close to one of the adjacent second trenches 135. Alternatively, the first dopant region 145 may be disposed close to one end of the second trench 135, for instance, nearing one end thereof which is close to the active region 11 side or nearing one end thereof which is away from the active region 11.

Figure 3B:
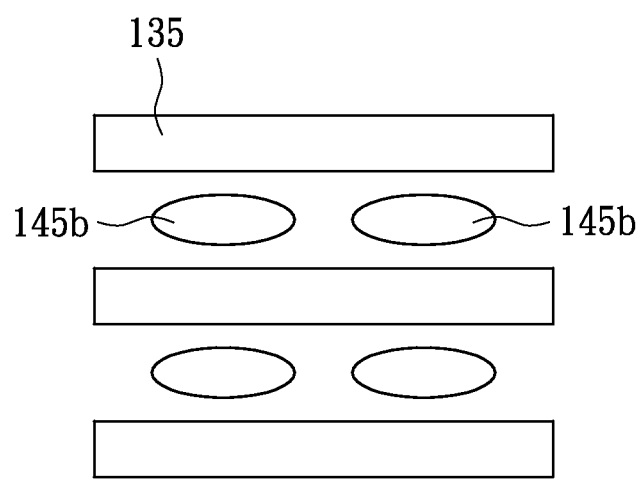

The first dopant region 145a as illustrated in FIG. 3B can be divided into multiple first dopant regions 145b of same size and respectively disposed between the adjacent second trenches 135 from one end of the second trench 135 nearing the active region 11 side toward the direction away from the active region 11. Additionally, the first dopant regions 145b of same size may be spaced by a distance. The first dopant regions 145b may have different or identical concentration of the first conductive type dopant, the instant disclosure is not limited thereby. Similarly, the first dopant regions 145b may have same or different implantation depth. Moreover the implantation depth of the first dopant regions 145b may be lower than the trench depth of the second trench 135 but the instant disclosure is not limited hereby.

Likewise, the second dopant region (not shown in FIG. 3A~3B) having dopant with conductive type the same or different from the epitaxial layer 1 may be adjusted according to the placement and the size of the first dopant region 145a, 145b so long as the second dopant region is above the first dopant region 145a and 145b, however, the instant disclosure is not limited thereto.

It shall be noted that the actual distribution and implantation position associated with the first dopant regions 145a, 145b and the second dopant region may be configured according to the required electrical field relaxation effect or voltage withstanding capability. FIG. 3A and FIG. 3B only serve as to illustrate one type of distribution and the present disclosure is not limited herein.

Third Embodiment

Figure 4A:
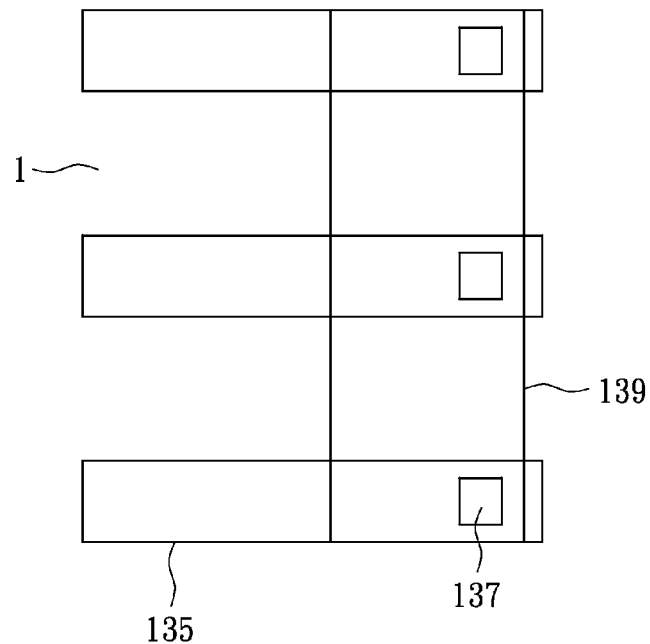
FIG. 4A~4B respectively show diagrams illustrating method of metal layer deposition in accordance to the third exemplary embodiment of the present disclosure.
Figure 4B:
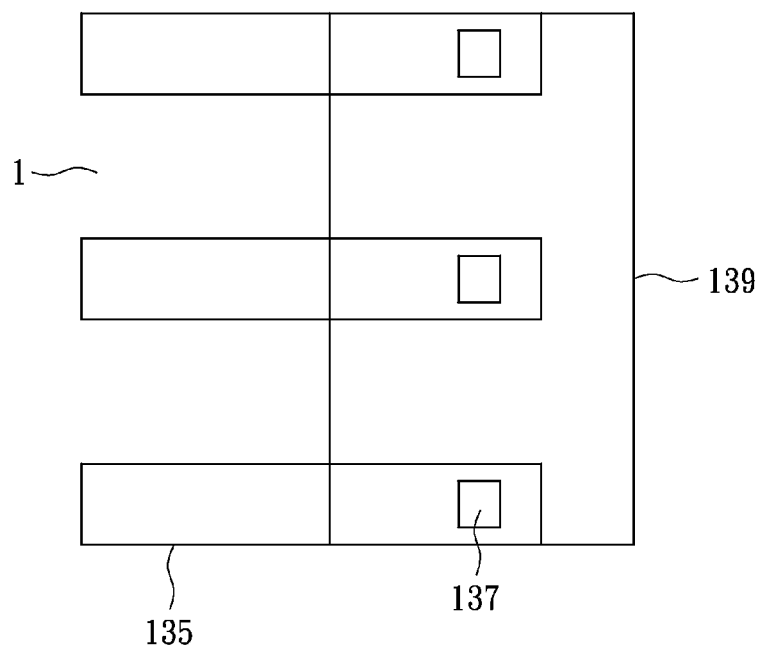

Please refer FIG. 4A and FIG. 4B which respectively show diagram illustrating method of metal layer deposition in accordance to the third exemplary embodiment of the present disclosure.

The metal layer 139 may electrically connect to the plurality of the second trenches 135 through the corresponding plurality of contact via 137. As shown in FIG. 4A, a plurality of contact vias 137 are respectively formed by vertically downward etching the surface of epitaxial layer 1 in corresponding to the placement of the second trenches 135 within the terminal region (not shown in FIGS. 4A and 4B). So that the contact vias 137 are electrically connected to the conductive structures (not shown in FIGS. 4A and 4B) formed by conductive material filled in the second trenches 135. Each of the second trenches 135 may electrically connect to the metal layer 139 through at least one contact via 137. Alternatively, the metal layer 139 may through the contact vias 137 electrically connect to the conductive structure formed inside the second trenches 135.

The metal layer 139 as previously described may be floating, grounded, or connect to the gate metal layer of the components within the active region 11 in FIG. 1. Consequently, by controlling the potential level of the metal layer, the conductive structures in the second trenches 135 may be driven to generate pinching effect creating electrical field relaxation effect and thereby increase voltage withstanding capability.

The metal layer 139 may cover the contact vias 137 on the second trenches 135. The length of the metal layer 139 may be equal to the trench length of the second trench 135 as shown in FIG. 4A. Or the length of the metal layer 139 may be greater than the trench length of the second trench 135 as shown in FIG. 4B. In other words, the metal layer 139 may be formed using the metal deposition method with the actual dimension configured according to the manufacturing needs and the instant embodiment is not limited thereto so long as the metal layer 139 can electrically connect to the conductive structures in the second trenches 135.

Fourth Embodiment

As described in previous embodiment, the second trenches located in the corner region of the trench power MOSFET may have different arrangements. Please refer to FIG. 5A~FIG. 5C in conjunction with FIG. 1, in which FIG. 5A~FIG. 5C respectively show diagram illustrating the arrangement of the second trenches in accordance to the fourth exemplary embodiment of the present disclosure.

In the first exemplary embodiment, as shown in FIG. 5A, the second trenches in the corner region 133 may be disposed in substantially fan-shaped arrangement with equal spacing (e.g., a preset distance D1) between the adjacent second trenches 135. However, the second trenches 135 within the corner region 133 may be disposed substantially in fan-shaped arrangement but with distance D2 disposed in between at one end closer to the active region being smaller than the distance D1 disposed between one end that is away from the active region. Additionally, the second trench 135 may be disposed in substantially fan-shaped arrangement but a preset angle (e.g., set the preset angle to be 45 degree) configured between the adjacent second trenches 135.

The second trenches 135 in the corner region 133 as shown in FIG. 5C may be disposed in substantially gear arrangement with equal spacing (i.e., distance D1) in the adjacent second trenches 135. The trench width of the second trenches 135 may be varies according to different arrangements of the second trenches. For instance, several second trenches 135 having narrower trench width in the one end thereof being closer to the active region 11 side than the other end thereof being away from the active region 11 side.

It shall be noted that, the arrangement of the second trenches 135 in the corner region 133 and the associated trench structure (e.g., trench length or width) may vary according to actual manufacturing process or voltage withstanding requirements (e.g., design space limitation of terminal region). Hence, FIG. 5A~FIG. 5C only serve as to illustrate possible arrangement of the second trenches 135 in the corner region 133 and the instant embodiment is not limited thereby.

Fifth Exemplary Embodiment

In the previous embodiments, the trench width and the trench structure of two ends associated with the second trench 135 may be configured according to the design needs. Please refer to FIG. 6A~FIG. 6E in conjunction with FIG. 1. FIG. 6A~FIG. 6E respectively show diagram illustrating the second trenches structure in accordance to the fifth exemplary embodiment of the present disclosure.

Figure 6A:
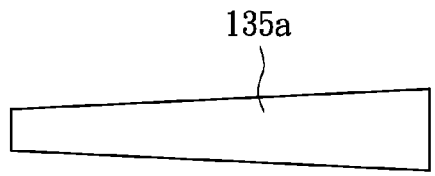
FIG. 6A~6E respectively show diagram illustrating the second trenches structure in accordance to the fifth exemplary embodiment of the present disclosure.
Figure 6B:
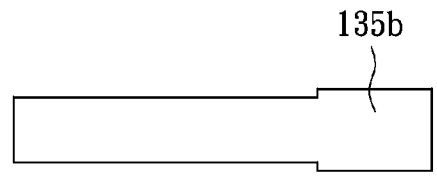
Figure 6C:
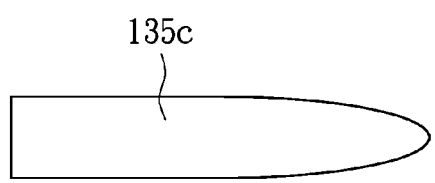
Figure 6D:
Figure 6E:
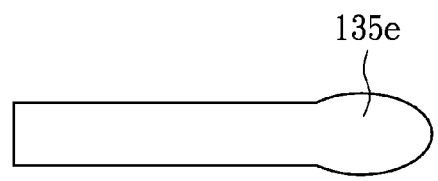

The second trench 135 may have the trench width associated with one of the two ends being narrower or wider than the other. In other words, as shown in FIG. 6A, the second trenches 135*a* may take form in substantially trapezoid shape within the terminal region 13. Specifically, the second trench 135*a* with one end thereof near the active region 11 side having the trench width smaller than the trench width of the other end thereof away from the active region 11 side. One side of the second trench 135 may as the second trench 135*b* described in FIG. 6B take form of square shape. The substantially squarely-shaped side has the trench width wider than the other end that is nearing the active region 11. Alternatively, the trench width of the side of the second trench 135*b* away from the active region 11 side can be smaller than the trench width of the other side that is nearing the active region 11. For instance, taking the second trench 135*c* in FIG. 6C as example, one end thereof away from the active region 11 may take form of a substantially bullet shape. The one end of the trench width of the second trench 135*c* is smaller than the trench width of the other end thereof that is nearing the active region. In addition, as depicted by the second trench 135*d* of FIG. 6D, one end thereof away from the active region may take form of a substantially round shape, wherein the one end taking form of substantially round shape has the trench width wider than the trench width of other end of the active region 11. The second trench 135 can be configured as the second trench 135*e* of FIG. 6E, in which the one end of the second trench 135*e* away from the active region may take form of substantially ellipse shape, wherein the one end taking form of substantially ellipse has the trench width wider than the trench width of the other end nearing the active region 11.

Incidentally, the shape of conductive structure (not shown) forming of conductive material may vary along with the actual structure of the second trench 135. In particular, the size of the conductive structure can be defined by the isolation layer deposited in the second trench 135. In other words, the ratio of the conductive structure and the isolation layer (not shown) disposed in the second trench 135*a*, 135*b*, 135*c*, 135*d*, and 135*e* may be configured according to the voltage withstanding capability and the present disclosure is not limited thereto.

It is worth to note that the physical shape of the second trench can be designed in correspondence to the manufacture or voltage withstanding capability. FIG. 6A~FIG. 6E represent various structure variation of the second trench, respectively and the preset disclosure is not limited thereby.

Sixth Exemplary Embodiment

Figure 7:
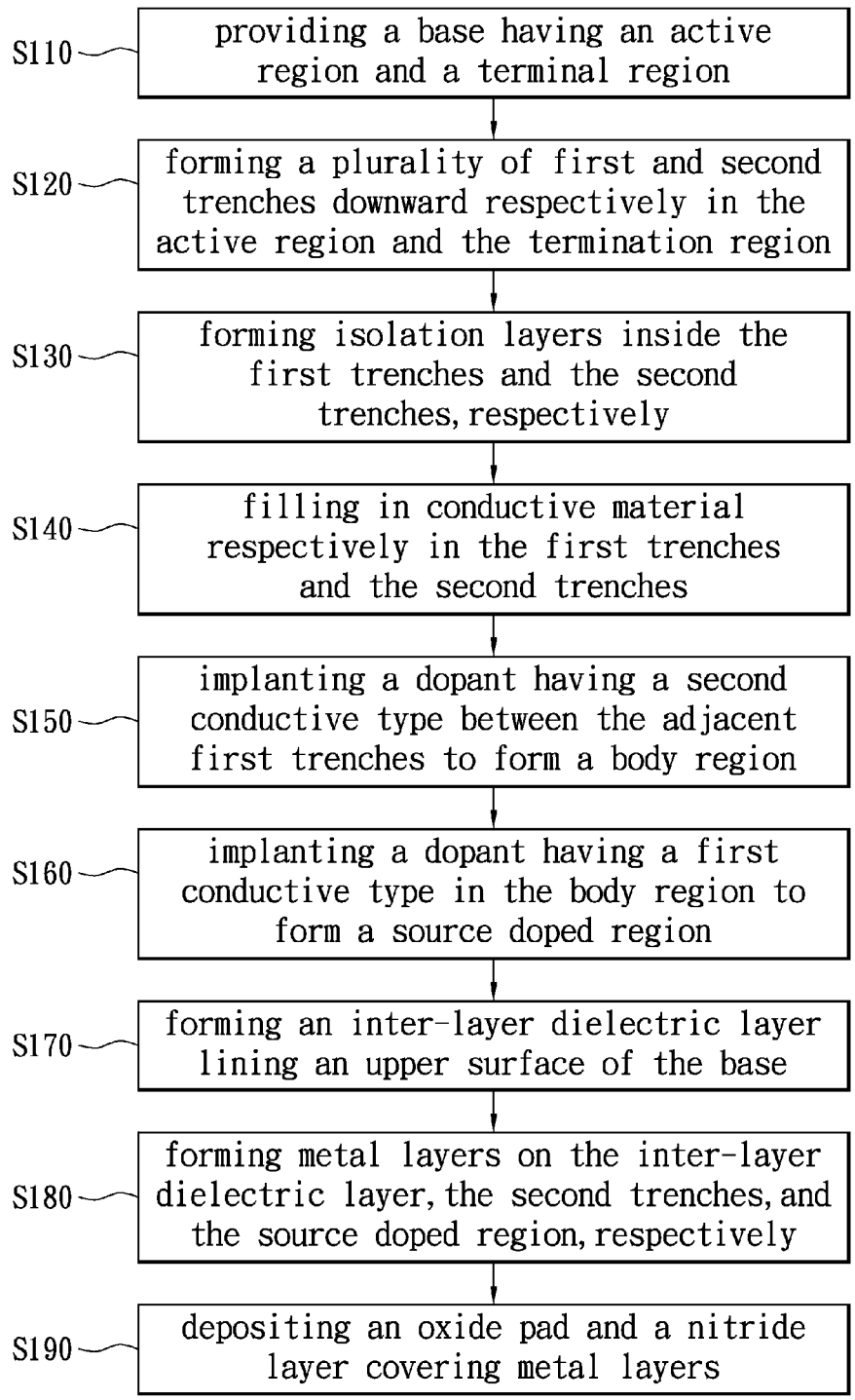
FIG. 7 shows a flow chart diagram illustrating fabrication method of a trench power MOSFET in accordance to the sixth exemplary embodiment of the present disclosure.

Next, please refer to FIG. 7 in conjunction with FIG. 8A~8K. FIG. 7 is a flow chart diagram illustrating fabrication method of a trench power MOSFET in accordance to the sixth exemplary embodiment of the present disclosure. FIG. 8A~8K show diagrams respectively illustrating the fabrication method of the trench power MOSFET in accordance to the sixth exemplary embodiment of the present disclosure.

Figure 8A:
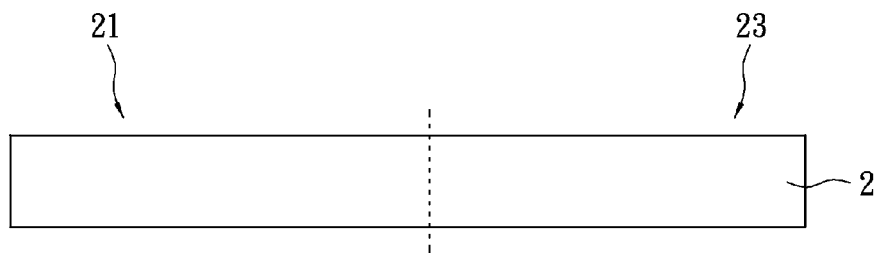
FIG. 8A~8K respective show diagrams illustrating the fabrication method of the trench power MOSFET in accordance to the sixth exemplary embodiment of the present disclosure.

As shown in FIG. 8A, executes Step S110 by providing a base (not shown), wherein the base may be formed of a substrate (not shown) and an epitaxial layer 2. To put it concretely, the epitaxial layer 2 having a first conductive type dopant can be grew on the substrate. However, in other embodiment, the base may the substrate, that is the active region 21 and the termination region 23 may be directly formed on the substrate without growing the epitaxial layer 2, thus the instant embodiment shall not be limited thereby. In addition, the first conductive type dopant may be an N-type dopant, but the instant embodiment is not limited herein. Specifically, the epitaxial layer 2 in the instant embodiment may be grown on the substrate using the epitaxial growth technique. The surface of the epitaxial layer 2 has an active region 21 and a termination region 23. The termination region 23 surroundingly arranged around the active region 21. The termination region 23 is disposed adjacent to the active region 21.

The substrate may be a silicon substrate having the first conductive type dopant. The drain region (not shown) of the trench power MOSFET is disposed on the bottom of the substrate. In practice, there is no limitation on the substrate type and the dopant type thereof, hence, the instant embodiment is not limited thereto.

Figure 8B:
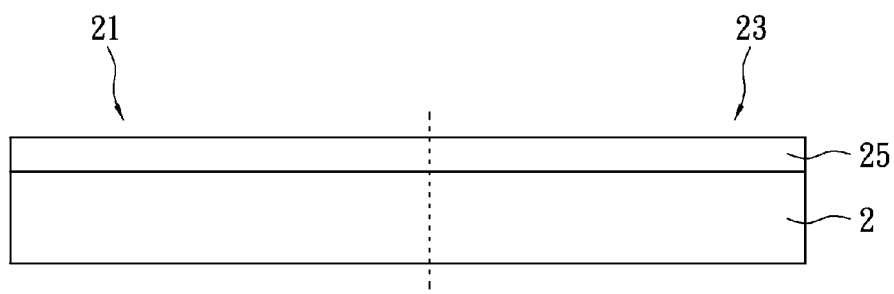

Subsequently as shown in FIG. 8B, forming an oxide layer 25 on the surface of the epitaxial layer 2, wherein the material of the oxide layer 25 may be silicon dioxide, however, the present disclosure is not limited.

Figure 8C:
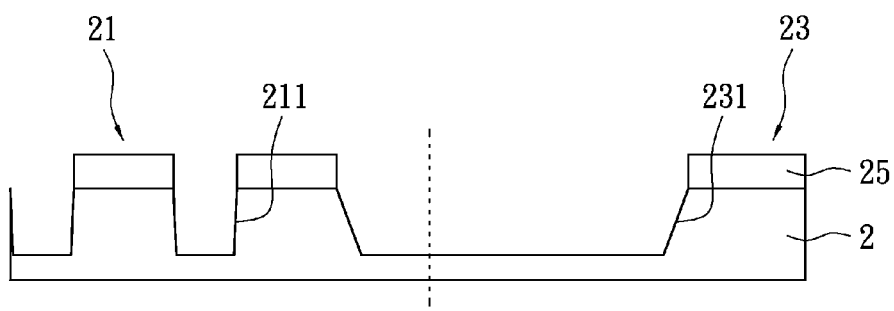
Figure 8D:
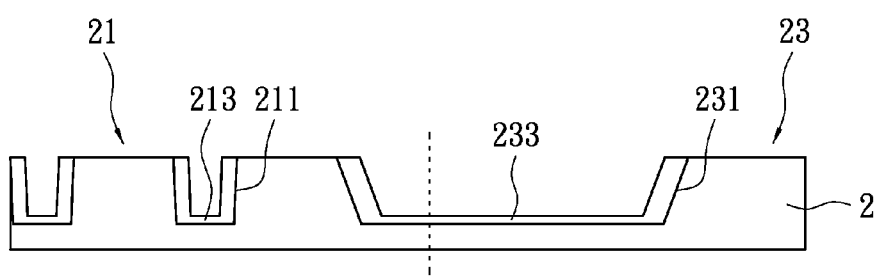
Figure 8E:
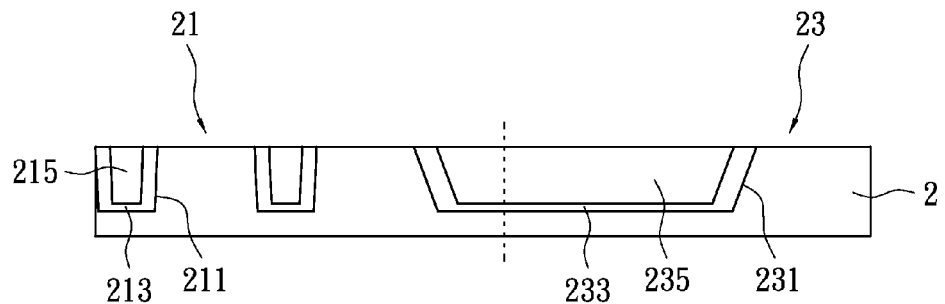

Afterward, in Step S120 and as shown in FIG. 8C, a plurality of the first trenches 211 is formed downwardly within the active region 21 on the epitaxial layer 2. Similarly, a plurality of the second trenches 231 is formed downwardly within the termination region 23. Specifically, the first trenches 211 and the second trenches 231 may be formed respectively in the active region 21 and the termination region 23 of the epitaxial layer 2 using same or different masks followed by lithography and etching processes. The mask includes patterns covering the corresponding pattern position and shape associated with the first and the second trenches 211, 231. The mask for the second trenches 231 may be designed according to the voltage withstanding requirement. The pattern for the second trenches 231 may be designed as shown in FIG. 6A~FIG. 6E, however, the instant embodiment is not limited to the example provided herein. The second trenches 231 may be radially arranged around the first trenches 211 in the active region 21. Each of the plurality of second trenches 231 is formed by extending outwardly from the adjacent first trenches 211 in the active region 21 side.

The termination region 23 may as the first exemplary embodiment has the side region (not shown in FIG. 8A~FIG. 8K) and the corner region (not shown in FIG. 8A~FIG. 8K). The second trenches 231 in the corner region are disposed in substantially fan-shaped arrangement, but the spacing between adjacent second trenches 231 may be equal spaced or configured according to the needs, the instant embodiment is not limited thereto. The arrangement for the second trenches 231 in the corner region may refer to FIG. 5A~FIG. 5C, however the instant embodiment is not limited thereto. The second trenches 231 in the side region may be disposed in substantially rectangular arrangement. The spacing between adjacent second trenches 231 is equal spacing or configured according to the needs, the instant embodiment is not limited thereto.

It is worth to note, the second trench 231 may be implemented through using the deep trench or the shallow trench isolation (STI) process.

Next, in Step S130 as shown in 8D, an isolation layer 213 (e.g., gate oxide layer) is formed in the plurality of the first trenches 211 and an isolation layer 233 is formed in the plurality of the second trenches 231. The isolation layers 213 and 233 may be formed in the first trenches 211 and the second trenches 135 using thermal oxidation or chemical vapor deposition. The isolation layer 213 and 233 in practice may comprise of isolation material such as oxide or silicon nitride, however the instant embodiment is not limited thereto.

Then as shown in 8E, respectively filling conductive material in the first trenches 211 and the second trenches 231 to form the conductive structures 215 in the first trenches 211 and the conductive structures 235 in the second trenches 231 (Step S140). In addition, the isolation layers 213 and 233 may be re-deposited in the first and the second trenches 213, 233 to cover the conductive structures 215, 235. The structure of the conductive structures 215 and the distance from the opening of the first trenches 211 may be defined by the isolation layer 213. Similarly, the structure of the conductive structures 235 and the distance from the opening of the second trenches 231 may be defined by the isolation layer 233. The isolation layer 213 may also be used to form two or more conductive structure in the second trench 231. The potential associated with multiple conductive structures are not limited to the same potential level. In addition the conductive material use to form the conductive structures 215, 235 may be conductive material such as polysilicon, aluminum, or copper, however the instant embodiment is not limited thereto.

Figure 8F:
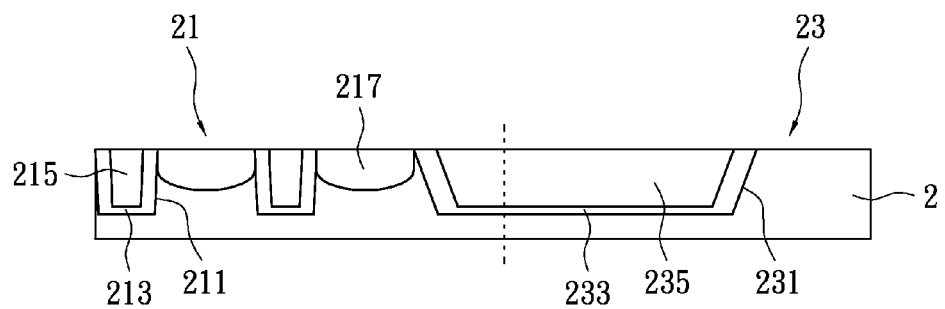

Next, as shown in FIG. 8F, in Step S150, implanting dopant having a second conductive type between the adjacent first trenches 211 by ion implantation and diffusing the dopant downwardly with drive-in process to form a body region 217. It is worth to note in the instant step, dopant with conductive type differ from the epitaxial layer 2 can be implanted between adjacent second trenches 231 to form at least a first dopant region (not shown). The concentration of the dopant in first dopant region, the implantation position, implantation number, and implantation depth may be configured according to voltage withstanding capability and the instant disclosure is not limited thereto. The second conductive type dopant may be P-type dopant however the instant disclosure is not limited thereto.

Figure 8G:
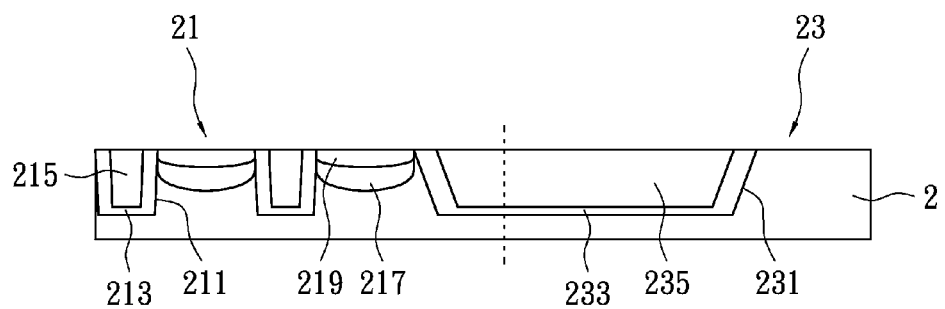
Figure 8H:
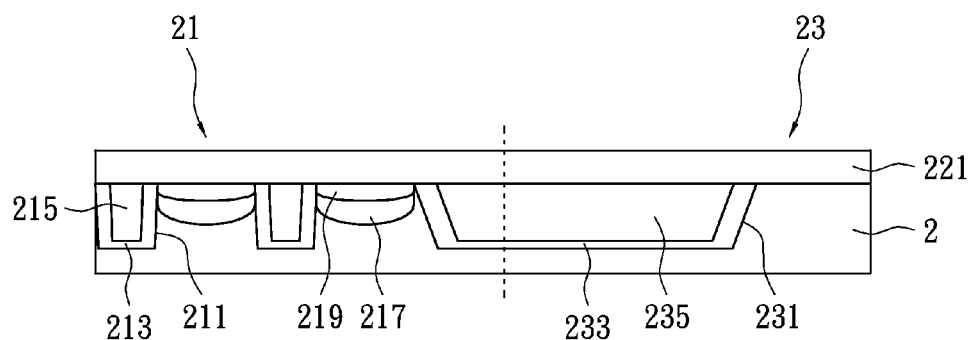
Figure 8I:
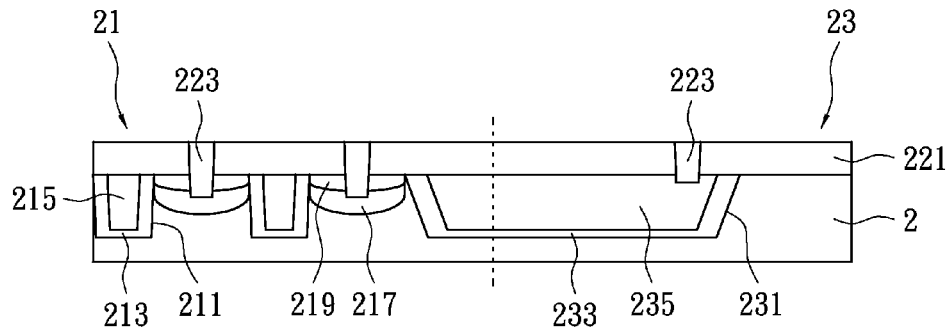

Subsequently, in Step S160 as shown in FIG. 8G, implanting dopant with first conductive type in the position corresponds to the position of the body region 217 to form the source region 219. Similarly, in the instant step, implanting dopant with conductive type the same as the conductive type of the epitaxial layer 2 (e.g., the first conductive type dopant) between the adjacent second trenches 231 corresponds to the position of the first dopant region to form at least a first second dopant region (not shown). As described previously, the second dopant region may be formed by implant dopant having conductive type differ from the epitaxial layer 2 and the instant embodiment is not limited thereto. The second dopant region in disposed on the first dopant region and the second dopant region is separated from the first dopant region. The concentration of the dopant in second dopant region, the implantation position, implantation number, and implantation depth may be configured according to voltage withstanding capability and the instant disclosure is not limited thereto. Incidentally, the relative position and alignment of the first and second dopant region are not limited in vertical direction, but also may be substantially parallel arranged. The first and the second dopant regions are not limited to the position between the adjacent second trenches 231.

Then in Step S170, as shown in FIG. 8, an inter-layer dielectric 221 is formed on the upper surface of epitaxial layer 2 through depositing undoped silicate glass (USG) or borophospho-silicate (BPSG) so as to cover the first and the second trenches 211 and 231, respectively. Afterward, as shown in FIG. 8I, a plurality of contact vias (CT) 223 are formed in the inter-layer dielectric 221 in corresponding to the position of the source region 219 and the conductive structure 235 in the second trenches 231 through lithography and etching processes. The plurality of contact vias 223 is electrically connected to the source region 219 and the conductive structures 235 in the second trenches 231.

Figure 8J:
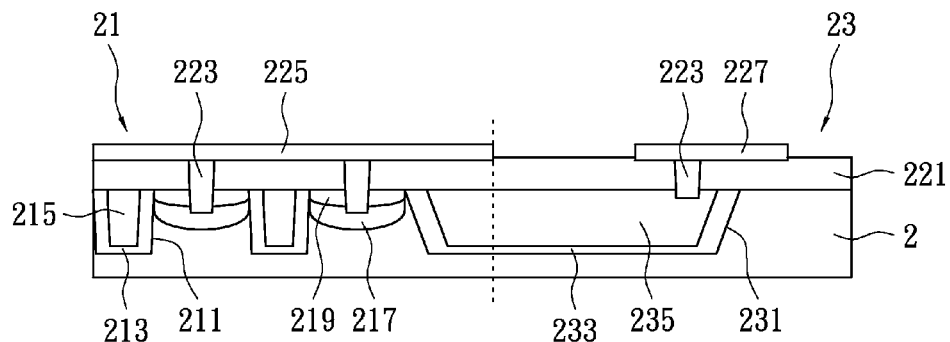

Afterward in Step S180 as shown in FIG. 8J, the metal layer is disposed on the epitaxial layer 2 and the inter-layer dielectric 221 in corresponding to the position of the source region 219 and the conductive structure 235 in the second trenches 231. Henceforth, a source metal layer 225 can be formed in corresponding to the position of source region 219 and the inter-layer dielectric 221 while a metal layer 227 can be formed on the conductive structure 235 in the second trenches 231 and the inter-layer dielectric 221. The source metal layer 225 can electrically connect to the source region 219 via contact vias 223. The metal 227 may electrically connect to the conductive structure in the second trench 231 via contact vias 223. In addition, the metal layer 227 may respectively be floating, grounded or connected to the gate metal layer (not shown) of the components in the active region 21 according to the voltage withstanding capability, however the present disclosure is not limited thereto.

Figure 8K:
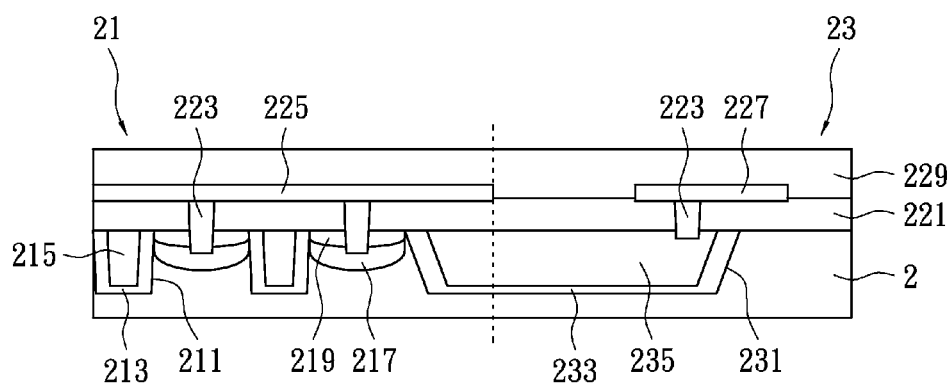

Lastly, in Step S190, as shown in FIG. 8K, depositing a protection layer 229 forming of oxide pad and nitride covering the source metal layer 225 and the metal layer 227 to protect the source metal layer 225 and the metal layer 227 thereby avoids the source metal layer 225 and the metal layer 227 from being polluted.

Consequently, the first trenches 211 in the active region 21 and the second trenches 231 in the termination region 23 may be formed at same time reducing the manufacturing complexity. Meanwhile, the voltage withstanding capability of the termination region may be adjusted through configuring the arrangement and the structure of the second trenches 231 and the arrangement of first and second dopant regions between the adjacent second trenches 231. It shall be noted FIG. 8A~8K only serve to illustrate the manufacturing process of the trench power MOSFET of the sixth embodiment and the present disclosure is not limited thereto.

In summary, an exemplary embodiment of the present disclosure provides a trench power MOSFET, in which reduce surface field (Resurf) principle may be utilized by disposing a plurality of trenches in the termination region surrounding the components in the active region, wherein each trench extends outwardly from the active region with isolation layer and a conductive material deposited inside so as to increase the associated voltage withstanding capability.

The trench power MOSFET can utilize the potential pinching effect formed from the conductive material disposed in the trenches located in the termination region creating the electrical field relaxation effect which can effectively increase the breakdown voltage of the trench power MOSFET. Consequently, the resistance and the thickness of the epitaxial layer can be correspondingly adjusted to reduce the on resistance thereby reduce the conductive loss. The present disclosure discloses that the voltage withstanding capability of the trench power MOSFET can be configured by correspondingly design the structure, shape, and arrangement associated with the trenches in the termination region, the distribution ratio of conductive material and the isolation layer inside each trench and the implantation method (e.g., concentration, number or placement) for the dopant region between the adjacent trenches.

Additionally, even though the embodiments of the present disclosure takes the manufacturing method of the trench power MOFET as examples, however the provided voltage withstanding design may be applied to other semiconductor manufacturing process including but not limited to Laterally Diffused Metal Oxide Semiconductor (LDMOS), Bipolar-CMOS-DMOS (BCD), or Ultra High Voltage (UHV) manufacturing processes. In the trench power MOSFET manufacturing process, the trench in the termination region can be formed at same time as the component in the active region reducing the manufacturing time while minimizing the required voltage withstanding design space thereby reduce the manufacturing cost.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. A trench power MOSFET, comprising:
   a base having an active region and a termination region surrounding the active region, wherein the termination region has at least a corner region;
   a plurality of first trenches, disposed in the active region; and
   a plurality of second trenches, disposed in the termination region, the second trenches surrounding the first trenches, each of the second trench having an isolation layer and a conductive material deposited inside, and the second trenches extended outwardly from the active region side toward an edge of the base, respectively;
   wherein the isolation layer is disposed to cover the inner surface of the second trench;
   wherein the second trenches are radially arranged around the active region, the second trenches in the corner region of the termination region are close together on a side facing the active region, and the second trenches space out as the second trenches extend away from the active region.

2. The trench power MOSFET according to claim 1, further comprising:
   at least a first doped region, formed between the adjacent second trenches, the conductive type of the first doped region is opposite to the conductive type of the base.

3. The trench power MOSFET according to claim 2, further comprising:
   at least a second doped region, formed between the adjacent second trenches, wherein the second doped region is disposed on the first doped region and the conductive type of the second doped region is the same as or opposite to the conductive type of the base.

4. The trench power MOSFET according to claim 1, wherein the terminal region has at least a side region and a corner region, the second trenches being disposed in fan-shaped arrangement in the corner region.

5. The trench power MOSFET according to claim 4, wherein the second trenches are disposed with equal spacing in the corner region.

6. The trench power MOSFET according to claim 4, wherein each of the second trenches in the corner region with one end thereof being nearing the active region side having the trench width smaller than the trench width of the other end thereof being away from the active region.

7. The trench power MOSFET according to claim 1, wherein each of the second trenches has conductive structure comprised of at least two conductive materials.

8. A trench power MOSFET, comprising:
   a base having an active region and a termination region surrounding the active region, wherein the termination region has at least a corner region;
   a plurality of first trenches, disposed in the active region; and
   a plurality of second trenches, disposed in the termination region, the second trenches surrounding the first trenches, each of the second trench having an isolation layer and a conductive material deposited inside, and the second trenches extended outwardly from the active region side toward an edge of the base, respectively;
   wherein the isolation layer is disposed to cover the inner surface of the second trench;
   wherein the second trenches are radially arranged around the active region, the second trenches in the corner region of the termination region are close together on a side facing the active region, and the second trenches space out as the second trenches extend away from the active region.

9. The trench power MOSFET fabrication method according to claim 8, further comprising:
   forming at least a first doped region between the adjacent second trenches, with the conductive type of the first doped region being the opposite to the conductive type of the base.

10. The trench power MOSFET fabrication method according to claim 9, further comprising:
    forming at least a second doped region between the adjacent second trenches and above the first doped region, the conductive type of the second doped region is the same or opposite to the conductive type of the base.

11. The trench power MOSFET fabrication method according to claim 8, wherein the terminal region has at least a side region and a corner region, the second trenches being disposed in fan-shaped arrangement in the corner region.

12. The trench power MOSFET fabrication method according to claim 11, wherein the second trenches are disposed with equal spacing in the corner region.

13. The trench power MOSFET fabrication method according to claim 11, wherein each of the second trenches in the corner region with one end thereof being nearing the active region side having the trench width smaller than the trench width of the other end thereof being away from the active region.

14. The trench power MOSFET according to claim 8, wherein each of the second trenches has the conductive structure comprising of at least two conductive materials.

* * * * *